US008643521B1

(12) United States Patent
Cheng et al.

(10) Patent No.: US 8,643,521 B1
(45) Date of Patent: Feb. 4, 2014

(54) DIGITAL-TO-ANALOG CONVERTER WITH GREATER OUTPUT RESISTANCE

(71) Applicant: United Microelectronics Corporation, Hsinchu (TW)

(72) Inventors: Hsueh-Chen Cheng, Hsinchu County (TW); Wen-Hong Hsu, Hsinchu (TW); Po-Hua Chen, Changhua County (TW); Yu-Yee Liow, Hsinchu County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/688,158

(22) Filed: Nov. 28, 2012

(51) Int. Cl.
*H03M 1/00* (2006.01)

(52) U.S. Cl.
USPC ............................ 341/136; 341/144; 341/154

(58) Field of Classification Search
USPC .......................................... 341/136, 144, 154
See application file for complete search history.

(56) References Cited

U.S. PATENT DOCUMENTS 3,663,828 A 5/1972 Low
3,818,402 A 6/1974 Golaski
4,163,944 A 8/1979 Chambers
4,245,355 A 1/1981 Pascoe
4,409,608 A 10/1983 Yoder
4,816,784 A 3/1989 Rabjohn
5,159,205 A 10/1992 Gorecki
5,208,725 A 5/1993 Akcasu
5,212,653 A 5/1993 Tanaka
5,406,447 A 4/1995 Miyazaki
5,446,309 A 8/1995 Adachi
5,583,359 A 12/1996 Ng
5,637,900 A 6/1997 Ker
5,760,456 A 6/1998 Grzegorek
5,808,330 A 9/1998 Rostoker
5,923,225 A 7/1999 De Los Santos
5,959,820 A 9/1999 Ker
6,008,102 A 12/1999 Alford
6,081,146 A 6/2000 Shiochi
6,172,378 B1 1/2001 Hull
6,194,739 B1 2/2001 Ivanov
6,246,271 B1 6/2001 Takada
6,285,578 B1 9/2001 Huang
6,291,872 B1 9/2001 Wang
6,370,372 B1 4/2002 Molnar
6,407,412 B1 6/2002 Iniewski
6,427,226 B1 7/2002 Mallick
6,448,858 B1 9/2002 Helms
6,452,442 B1 9/2002 Laude
6,456,221 B2 9/2002 Low
6,461,914 B1 10/2002 Roberts
6,480,137 B2 11/2002 Kulkarni
6,483,188 B1 11/2002 Yue
6,486,765 B1 11/2002 Katayanagi
6,509,805 B2 1/2003 Ochiai
6,518,165 B1 2/2003 Yoon (Continued)

*Primary Examiner* — Khai M Nguyen
(74) *Attorney, Agent, or Firm* — Ding Yu Tan

(57) ABSTRACT

A DAC has at least one bit current-steering circuit. In the DAC, the current-steering circuit has a current source circuit, a switch, a feedback circuit, and an amplifier circuit. The current source circuit is disposed for outputting a bias current to the switch and coupled to the amplifier circuit. The switch has a first input/output terminal coupled to output an analog signal, a control terminal coupled to the feedback circuit, and a second input/output terminal for receiving the bias current, so that the first switch determines whether the first and the second input/output terminals are conducted according to a status of the control terminal.

10 Claims, 5 Drawing Sheets

(56) References Cited

U.S. PATENT DOCUMENTS

| | | | |
|---|---|---|---|
| 6,521,939 | B1 | 2/2003 | Yeo |
| 6,545,547 | B2 | 4/2003 | Fridi |
| 6,560,306 | B1 | 5/2003 | Duffy |
| 6,588,002 | B1 | 7/2003 | Lampaert |
| 6,593,838 | B2 | 7/2003 | Yue |
| 6,603,360 | B2 | 8/2003 | Kim |
| 6,603,417 | B2 | 8/2003 | Greig |
| 6,608,363 | B1 | 8/2003 | Fazelpour |
| 6,611,223 | B2 | 8/2003 | Low |
| 6,625,077 | B2 | 9/2003 | Chen |
| 6,630,897 | B2 | 10/2003 | Low |
| 6,639,298 | B2 | 10/2003 | Chaudhry |
| 6,653,868 | B2 | 11/2003 | Oodaira |
| 6,668,358 | B2 | 12/2003 | Friend |
| 6,700,771 | B2 | 3/2004 | Bhattacharyya |
| 6,720,608 | B2 | 4/2004 | Lee |
| 6,724,677 | B1 | 4/2004 | Su |
| 6,756,656 | B2 | 6/2004 | Lowther |
| 6,795,001 | B2 | 9/2004 | Roza |
| 6,796,017 | B2 | 9/2004 | Harding |
| 6,798,011 | B2 | 9/2004 | Adan |
| 6,810,242 | B2 | 10/2004 | Molnar |
| 6,822,282 | B2 | 11/2004 | Randazzo |
| 6,822,312 | B2 | 11/2004 | Sowlati |
| 6,833,756 | B2 | 12/2004 | Ranganathan |
| 6,841,847 | B2 | 1/2005 | Sia |
| 6,847,572 | B2 | 1/2005 | Lee |
| 6,853,272 | B1 | 2/2005 | Hughes |
| 6,876,056 | B2 | 4/2005 | Tilmans |
| 6,885,534 | B2 | 4/2005 | Ker |
| 6,901,126 | B1 | 5/2005 | Gu |
| 6,905,889 | B2 | 6/2005 | Lowther |
| 6,909,149 | B2 | 6/2005 | Russ |
| 6,927,664 | B2 | 8/2005 | Nakatani |
| 6,958,522 | B2 | 10/2005 | Clevenger |
| 7,009,252 | B2 | 3/2006 | Lin |
| 7,027,276 | B2 | 4/2006 | Chen |
| 7,205,612 | B2 | 4/2007 | Cai |
| 7,262,069 | B2 | 8/2007 | Chung |
| 7,365,627 | B2 | 4/2008 | Yen |
| 7,368,761 | B1 | 5/2008 | Lai |
| 7,405,642 | B1 | 7/2008 | Hsu |
| 7,672,100 | B2 | 3/2010 | Van Camp |
| 7,701,370 | B2 * | 4/2010 | Lee ............................... 341/135 |
| 8,330,633 | B2 * | 12/2012 | Brubaker et al. ............. 341/136 |
| 2002/0019123 | A1 | 2/2002 | Ma |
| 2002/0036545 | A1 | 3/2002 | Fridi |
| 2002/0188920 | A1 | 12/2002 | Lampaert |
| 2003/0076636 | A1 | 4/2003 | Ker |
| 2003/0127691 | A1 | 7/2003 | Yue |
| 2003/0183403 | A1 | 10/2003 | Kluge |
| 2005/0068112 | A1 | 3/2005 | Glenn |
| 2005/0068113 | A1 | 3/2005 | Glenn |
| 2005/0087787 | A1 | 4/2005 | Ando |
| 2006/0006431 | A1 | 1/2006 | Jean |
| 2006/0108694 | A1 | 5/2006 | Hung |
| 2006/0267102 | A1 | 11/2006 | Cheng |
| 2007/0102745 | A1 | 5/2007 | Hsu |
| 2007/0210416 | A1 | 9/2007 | Hsu |
| 2007/0234554 | A1 | 10/2007 | Hung |
| 2007/0246801 | A1 | 10/2007 | Hung |
| 2007/0249294 | A1 | 10/2007 | Wu |
| 2007/0296055 | A1 | 12/2007 | Yen |
| 2008/0094166 | A1 | 4/2008 | Hsu |
| 2008/0185679 | A1 | 8/2008 | Hsu |
| 2008/0189662 | A1 | 8/2008 | Nandy |
| 2008/0200132 | A1 | 8/2008 | Hsu |
| 2008/0299738 | A1 | 12/2008 | Hsu |
| 2008/0303623 | A1 | 12/2008 | Hsu |
| 2009/0029324 | A1 | 1/2009 | Clark |
| 2009/0201625 | A1 | 8/2009 | Liao |
| 2010/0279484 | A1 | 11/2010 | Wang |
| 2011/0221620 | A1 | 9/2011 | Mahajan |

* cited by examiner

DIGITAL-TO-ANALOG CONVERTER WITH GREATER OUTPUT RESISTANCE

FIELD OF THE INVENTION

The present invention relates to a digital-to-analog converter (DAC), and more particularly to a current-steering DAC.

BACKGROUND OF THE INVENTION

FIG. 1A is a schematic diagram of an N-bit current-steering digital-to-analog converter. Referring FIG. 1A, the DAC 100 has N current sources $2^{N-1}I_{LSB}$, $2^{N-2}I_{LSB}$, . . . $I_{LSB}$, and N switches $b_N$, $b_{N-1}$, . . . $b_1$. Each of current sources $2^{N-1}I_{LSB}$, $2^{N-2}I_{LSB}$, . . . $I_{LSB}$ is coupled to one of switches $b_N$, $b_{N-1}$, . . . $b_1$ respectively. In addition, a resistance $R_L$ has a first terminal coupled to a common voltage $V_{com}$, and a second terminal coupled to the N current sources $2^{N-1}I_{LSB}$, $2^{N-2}I_{LSB}$, . . . $I_{LSB}$ through the switches $b_N$, $b_{N-1}$, . . . $b_1$. Therefore, when one of the switches turns on, an output current $I_{out}$ would be generated by the corresponding current sources coupled to the conducted switch.

When one of switches $b_N$, $b_{N-1}$, . . . $b_1$ turns on, the DAC 100 has a corresponding output resistance $R_{unit}$, such as shown in FIG. 1B. In addition, in the equivalent circuit of output resistance, the resistance $R_L$ would be equivalent to parallel connected resistor $R_{load}$ and capacitor $C_{load}$. Wherein, a ratio of the output resistance $R_{unit}$ and the equivalent resistor $R_{load}$ could be written as follows.

$$R_{ratio} = \frac{1}{\rho} = \frac{R_{unit}}{R_{load}}$$

Therefore, values of differential nonlinearity (DNL) and integral nonlinearity (INL) could be written as follows.

$$DNL_k \cong \frac{I_{unit}}{(1+\rho\cdot k)^2} - I_{unit}$$

$$INL_k = \sum_{i=0}^{k} DNL_i = I(k) - I(0) - k\cdot I_{unit}$$

In addition, a value of spurious-free dynamic range (SFDR) could be written as follows $$SFDR \cong \left(2\cdot\frac{R_{ratio}+2^{N-1}}{2^{N-1}}\right)^2$$

Since the value of DNL needs to be as small as possible and the value of SFDR needs to be as great as possible, thus ρ would be as small as possible. Therefore, the output resistance $R_{unit}$ needs to be as great as possible.

SUMMARY OF THE INVENTION

Therefore, an embodiment of present invention provides a DAC.

A DAC provided by the present invention has at least one bit current-steering circuit. Wherein, the at least one bit current-steering circuit comprises a current source circuit, a first switch, a first feedback circuit, and a first amplifier circuit. The current source circuit is coupled to the first switch for outputting a bias current. The first switch has a first input/output terminal coupled to a first output terminal of the current-steering circuit, a control terminal, and a second input/output terminal receiving the bias current, so that the first switch determines whether the first and the second input/output terminals are conducted according to a status of the control terminal. The first feedback circuit includes a first transistor and a first resistance element. The first transistor has a first source/drain terminal coupled to the control terminal of the first switch, a second source/drain terminal, and a gate terminal. Additionally, the first resistance element has a first terminal coupled to the gate terminal of the first transistor, and a second terminal coupled to the first input/output terminal of the first switch. In addition, the first amplifier circuit has an input terminal coupled to the second input/output terminal of the first switch, an output terminal coupled to the second source/drain terminal of the first transistor, and a voltage terminal coupled to a voltage source.

Due to the first feedback circuit and the first amplifier circuit are being coupled to the first switch, the output resistance of the DAC would become greater.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
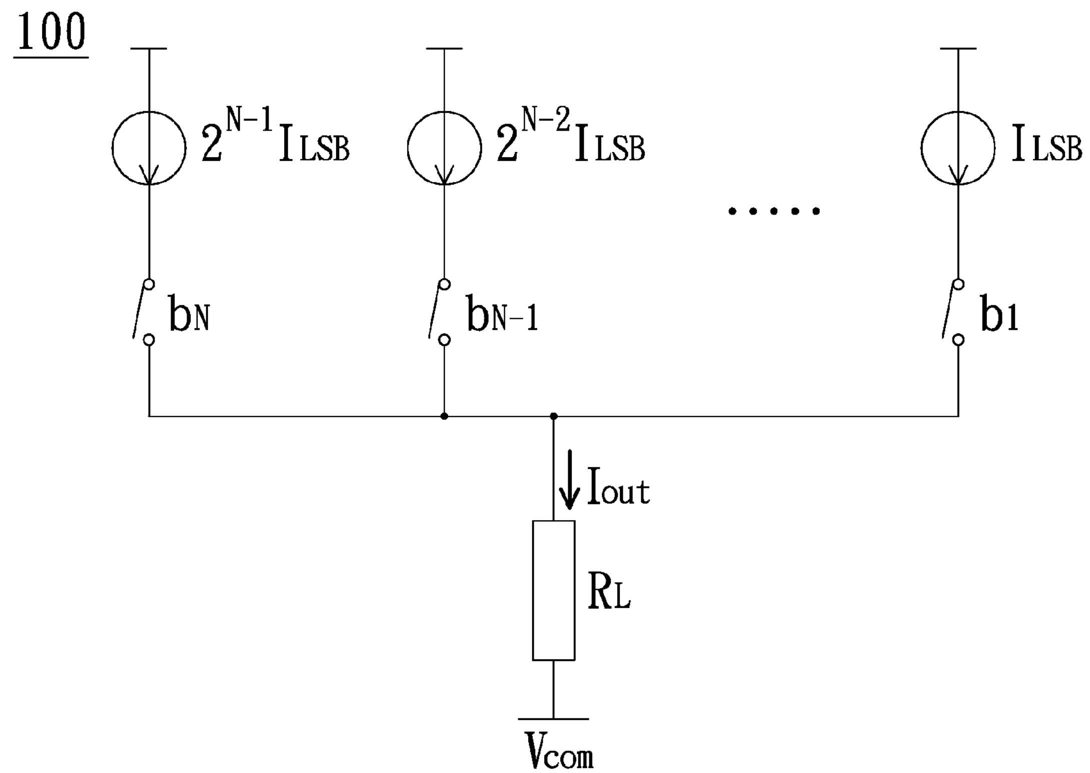
FIG. 1A is a schematic diagram of an N-bit current-steering digital-to-analog converter.
Figure 1B:
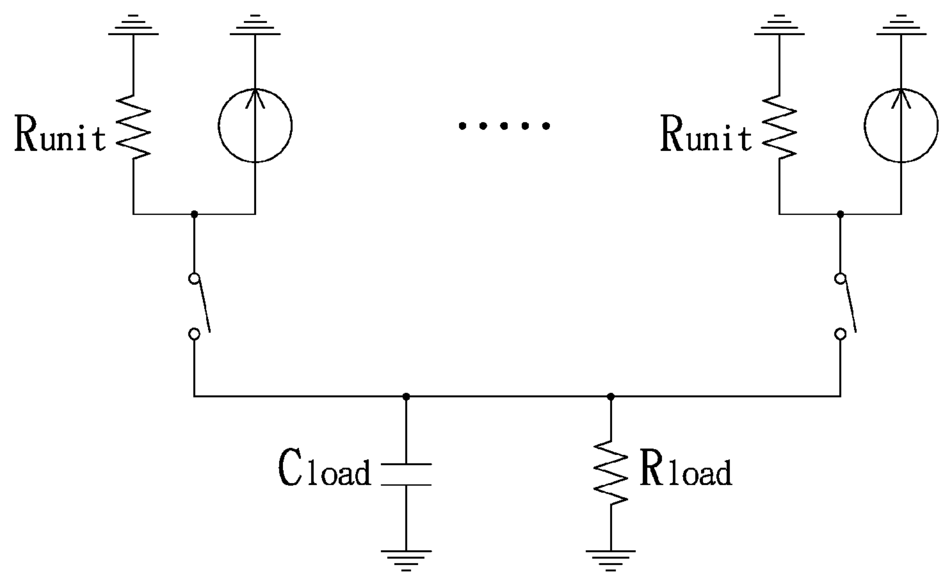
FIG. 1B is an equivalent circuit diagram of output resistance in the small signal model of the N-bit current steering DAC shown in FIG. 1A.
Figure 2A:
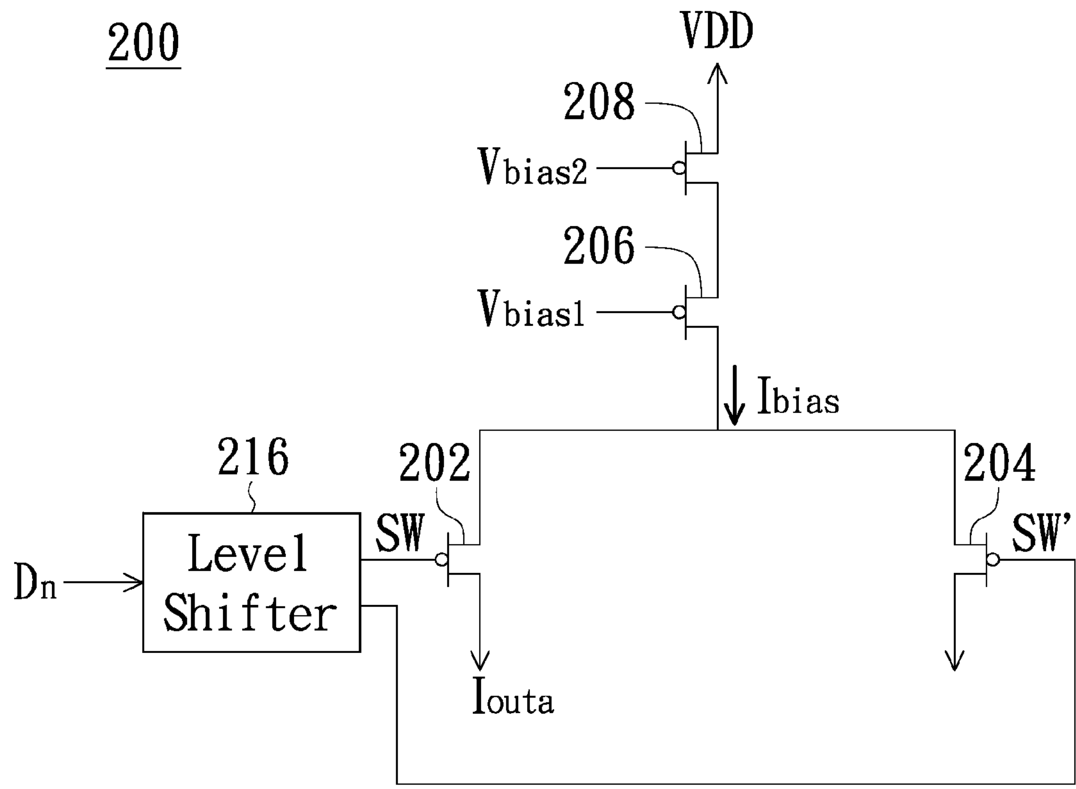
FIG. 2A is a circuit diagram of a current-steering DAC.

FIG. 2A is a circuit diagram of a current-steering DAC. Referring FIG. 2A, the current-steering DAC 200 comprises a plurality of switch transistors 202 and 204, and a level shifter 216. The switch transistor 202 has a first source/drain terminal coupled to a first output terminal of the current-steering DAC 200, a gate terminal coupled to a first output terminal of the level shifter 210, and a second source/drain terminal. Similarly, the switch transistor 204 has a first source/drain terminal coupled to a second output terminal of the current-steering DAC 200, a gate terminal coupled to a second output terminal of the level shifter 210, and a second source/drain terminal thereof coupled to the second source/drain terminal of the (first) switch transistor 202.

Wherein, the level shifter 210 receives a switch signal $D_n$, and shifts the potential of the switch signal $D_n$, so as to output a switch signal SW from the first output terminal thereof to the switch transistor 202, and an inverted switch signal SW' from the second output terminal thereof to the switch transistor 204. In some embodiments, the potential difference between the switch signal SW and the inverted switch signal SW' substantially equals to VDD−0.

In addition, the current-steering DAC 200 has a plurality of bias transistors 206 and 208. The bias transistor 206 has a first source/drain terminal coupled to the second source/drain terminal of the switch transistor 202, a gate terminal coupled to a bias voltage $V_{bias1}$, and a second source/drain terminal. In addition, the bias transistor 208 has a first source/drain terminal coupled to the second source/drain terminal of the bias transistor 206, a gate terminal coupled to a bias voltage $V_{bias2}$, and a second source/drain terminal coupled to the voltage source VDD.

When the current-steering DAC 200 would output an analog signal, as $I_{outa}$ from the first output terminal of the current-steering DAC 200, the switch signal SW would be set low. Therefore, the switch transistor 202 would turn on, and the switch transistor 204 turns off. Additionally, the bias transistors 206 and 208 would generate a bias current $I_{bias}$ to the switch transistor 202. Thus, the output analog signal $I_{outa}$ would be outputted from the first output terminal of the current-steering DAC 200.

Figure 2B:
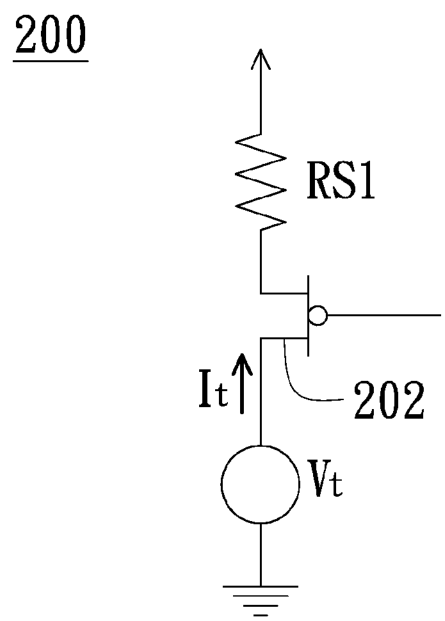
FIG. 2B is an equivalent circuit diagram of output resistance in the small signal model of the current-steering DAC shown in FIG. 2A.

FIG. 2B is an equivalent circuit diagram of output resistance of the current-steering DAC 200 shown in FIG. 2A. Referring FIG. 2B, in the equivalent circuit of the current-steering DAC 200, the output resistance $R_{out1}$ would be written as follows.

$$R_{out1} = \frac{V_t}{I_t} = gm_1 \times rds_1 \times RS1$$

Wherein, the parameter of $gm_1$ is the small signal gain of the switch transistor 202, and $rds_1$ is the small signal resistor between the first and second source/drain terminals of the switch transistor 202.

Referring FIG. 2A again, a parasitic capacitor is existed between the gate terminal and the first source/drain terminal of the switch transistor 202. Therefore, when the switch signal SW goes high for turning off the switch transistor 202, some charges would still be stored in the parasitic capacitance of the switch transistor 202 and could not be released. Thus, a clock feedthrough effect may occur, thereby causing the output analog signal $I_{outa}$ to be jiggling.

Figure 3A:
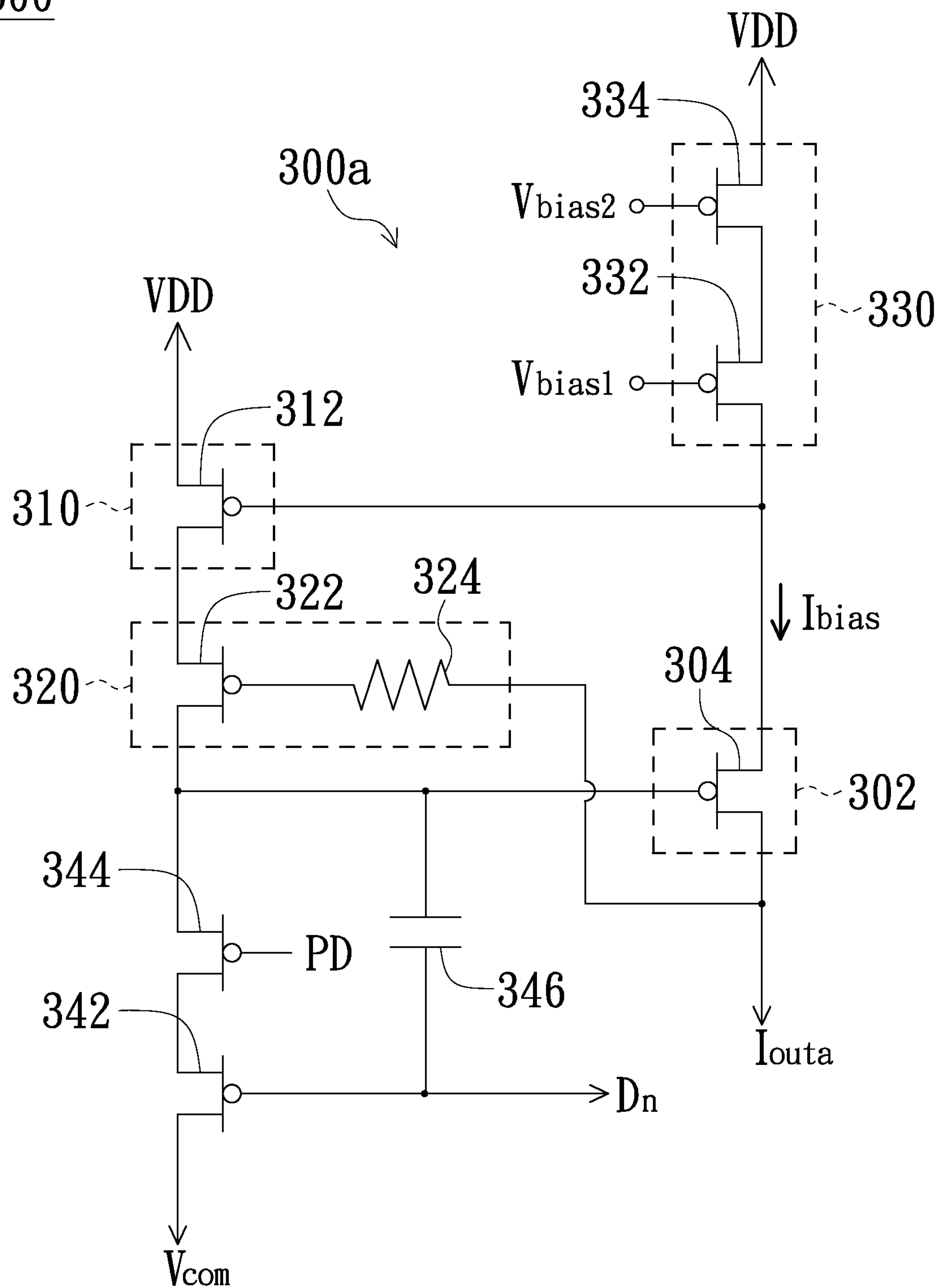
FIG. 3A is a circuit diagram of a DAC according to one embodiment of the present invention.

FIG. 3A is a circuit diagram of a DAC according to one embodiment of the present invention. Referring FIG. 3A, a DAC 300 provided by the embodiment comprises at least one bit current-steering circuit 300*a* which has a switch 302, an amplifier circuit 310, a feedback circuit 320, and a current source circuit 330. The switch 302 has a first input/output terminal coupled to a first output terminal of the DAC 300, a second input/output terminal coupled to an output terminal of the current source circuit 330, and a control terminal coupled to the feedback circuit 320. In this embodiment, the switch 302 can be implemented by a transistor 302 having a first and a second source/drain terminals coupled to the first and the second input/output terminals of the switch 302 respectively, and a gate terminal coupled to the control terminal of the switch 302.

The current source circuit 330 comprises the transistors 332 and 334. The transistor 332 has a first source/drain terminal coupled to the second source/drain terminal of the transistor 304 and an input terminal of the amplifier circuit 310 through the output terminal of the current source circuit 330, a gate terminal coupled to the bias voltage $V_{bias1}$, and a second source/drain terminal. Similarly, the transistor 334 also has a first source/drain terminal coupled to the second source/drain terminal of the transistor 332, a gate terminal coupled to the bias voltage $V_{bias2}$, and a second source/drain terminal coupled to a voltage source VDD.

Additionally, the amplifier circuit 310 further has a voltage terminal coupled to the voltage source VDD, and an output terminal coupled to the feedback circuit 320. The amplifier circuit 310 can be implemented by a common source amplifier or an operational (OP) amplifier. In this embodiment, the amplifier circuit 310 is a common source amplifier including a transistor 312, wherein the transistor 312 has a first source/drain terminal coupled to the output terminal of the amplifier circuit 310, a gate terminal coupled to the input terminal of the amplifier circuit 310, and a second source/drain terminal coupled to the voltage source VDD through the voltage terminal of the amplifier circuit 310.

The feedback circuit 320 includes a transistor 322 and a resistance element 324, such as a resistor. The transistor 322 also has a first source/drain terminal coupled to the gate terminal of the transistor 304, a gate terminal coupled to the first source/drain terminal of the transistor 304 through the resistor 324, and a second source/drain terminal coupled to the first source/drain terminal of the transistor 312. Generally, the resistance value of the resistor 324 can be designed to take on a large value.

Furthermore, the current-steering circuit 300*a* further includes the transistors 342 and 344, and a capacitor 346. The transistor 342 has a first source/drain terminal coupled to a common voltage $V_{com}$ (e.g., 0V), a gate terminal coupled to the switch signal $D_n$ and the gate terminal of the transistor 304 through the capacitor 346, and a second source/drain terminal. The transistor 344 also has a first source/drain terminal coupled to the second source/drain terminal of the transistor 342, a gate terminal coupled to a control signal PD, and a second source/drain terminal coupled to the gate terminal of the transistor 342 through the capacitor 346.

In this embodiment, the current source circuit 330 could output the bias current $I_{bias}$ from the output terminal thereof to the switch 302. Therefore, when the control signal PD and the switch Dn goes low causing the transistors 344 and 342 to be turning on, the transistor 304 would generate the output analog signal $I_{outa}$ which is outputted from the first output terminal of the DAC 300.

Figure 3B:
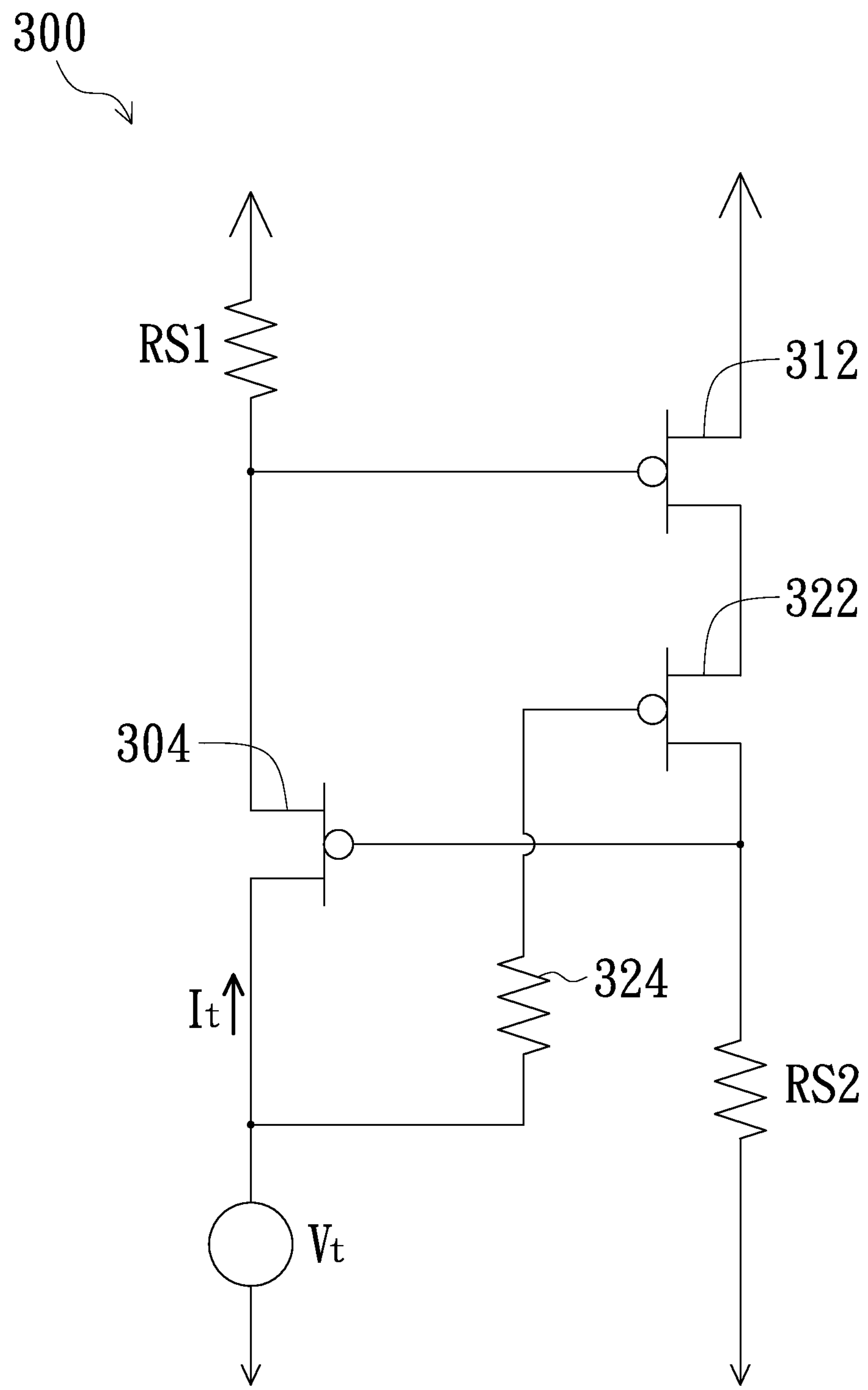
FIG. 3B is an equivalent circuit diagram of output resistance in the small signal model of the DAC 300 shown in FIG. 3A.

FIG. 3B is an equivalent circuit diagram of output resistance in the small signal model of the DAC 300 shown in FIG. 3A. Referring FIGS. 3A and 3B, the transistors 332 and 334 would be equivalent to the resistor RS1, and the transistors 342 and 344, and the capacitor 346 would be equivalent to the resistor RS2. The output resistance $R_{out2}$ of DAC 300 would be determined in an equation as follows.

$$R_{out2} = \frac{V_t}{I_t} = \frac{gm_1 \times gm_3 \times rds_1 \times rds_2 \times rds_3 \times RS1(1 + gm_2 \cdot RS2)}{RS2 + rds_2 + rds_3 + gm_3 \cdot rds_2 \cdot rds_3 - gm_1 \cdot gm_3 \cdot rds_1 \cdot rds_3 \cdot RS2}$$

Wherein, the parameters of $gm_1$, $gm_2$, and $gm_3$ are the small signal gains of the transistors 304, 312 and 322 respectively.

In addition, the parameters of $rds_1$, $rds_2$, and $rds_3$ in the above equation are the small signal resistors between the first and second source/drain terminals of transistors 304, 312 and 322 respectively. Therefore, the resistance value of the output resistance $R_{out2}$ be greater than that of the output resistance $R_{out1}$.

In addition, because the resistor 324 can be designed relatively large, the DAC 300 also has the function of preventing electro-static discharge (ESD).

Figure 4:
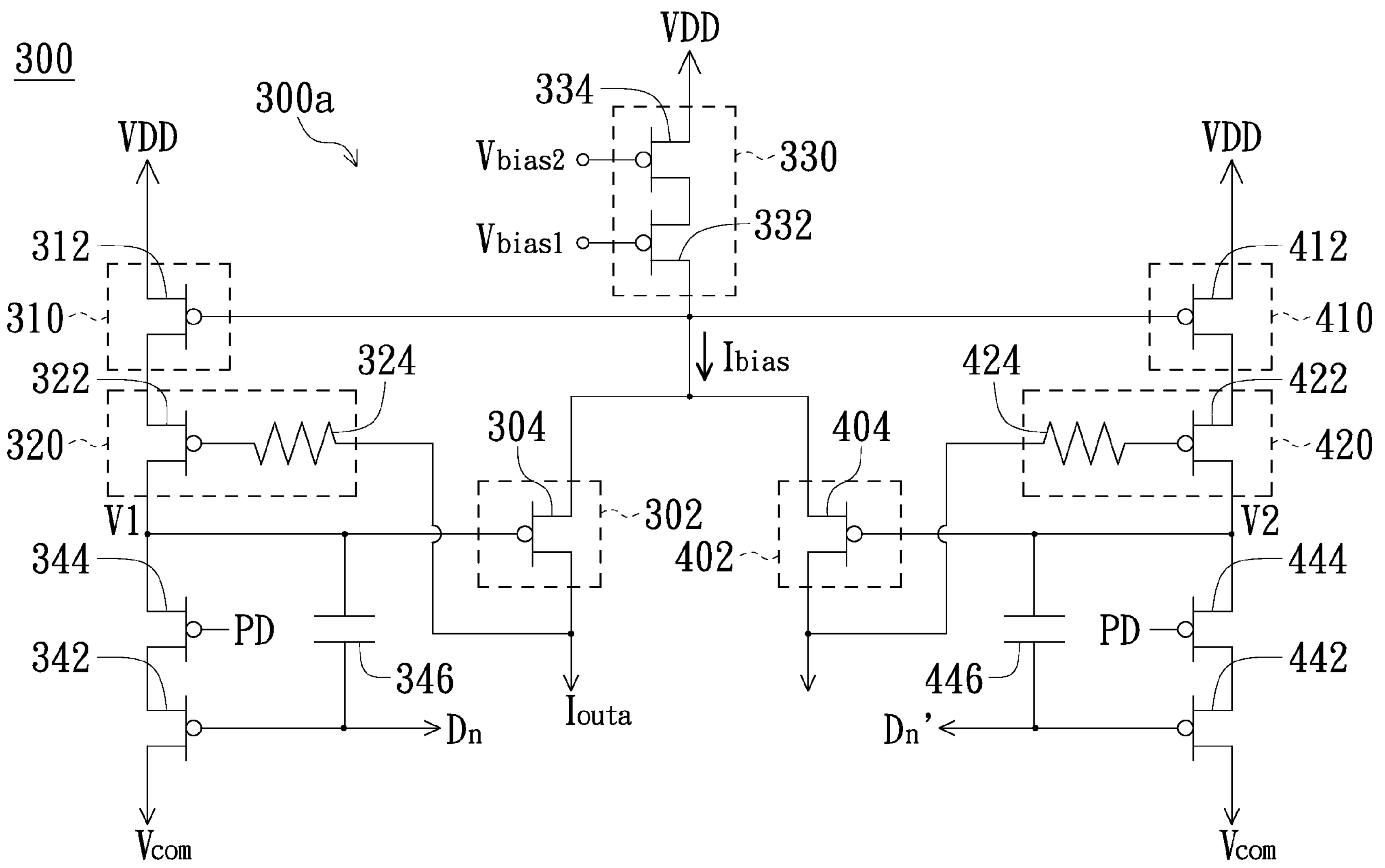
FIG. 4 is a circuit diagram of a DAC according to another embodiment of the present invention.

FIG. 4 is a circuit diagram of a DAC according to another embodiment of the present invention. Referring FIG. 4, in this embodiment, the current-steering circuit 300*a* further has another switch 402, another amplifier circuit 410, and another feedback circuit 420. Furthermore, the current-steering circuit 300*a* provided by this embodiment also has the transistors 442 and 444, and the capacitor 446.

The switch 402 has the transistor 404 just like the switch 302. The transistor 404 has a first source/drain terminal coupled to a second output terminal of the DAC 300, a gate terminal coupled to the feedback circuit 420, and a second source/drain terminal coupled to the second source/drain terminal of the transistor 304.

Both the structures of the amplifier circuits 410 and 310 are the same. In this embodiment, the amplifier circuit 410 is also a common source amplifier including a transistor 412 which has a first source/drain terminal, a gate terminal coupled to the gate terminal of the transistor 312, and a second source/drain terminal coupled to the voltage source VDD.

Similarly, the feedback circuit 420 has a transistor 422 and a resistance element 424, such as a resistor. The transistor 422 has a first source/drain terminal coupled to the gate terminal of the transistor 404, a gate terminal coupled to the first source/drain terminal of the transistor 404 through the resistor 424, a second source/drain terminal coupled to the first source/drain terminal of the transistor 412.

In addition, the transistor 442 has a first source/drain terminal coupled to the common voltage V a gate terminal coupled to an inverted switch signal Dn' and the gate terminal of the transistor 404 through the capacitor 446, and a second source/drain terminal. The transistor 444 also has a first source/drain terminal coupled to the second source/drain of the transistor 442, a gate terminal coupled to the control signal PD, a second source/drain terminal coupled to the gate terminal of the transistor 442 through the capacitor 446.

The transistors 304 and 404 are determined as to whether or not to be turning on according to the voltage potentials V1 and V2 of the gate terminal thereof respectively. The potential difference between V1 and V2 is less than (VDD−0), because the potential of Dn is between VDD and 0. Therefore, even when the voltage potential V1 goes high causing the transistor 304 to be turning off, the charges originally stored in the parasitic capacitor between the gate terminal and the first source/drain terminal of the transistor 304 also can be released. Therefore, the clock feedthrough effect can be solved.

In summary, because the DAC of the present invention has the amplifier circuit and the feedback circuit coupled to the switch, the DAC has greater output resistance. In addition, the resistance value of the resistor in the feedback circuit can be designed to take on a large value, the DAC of the present invention has the function of preventing ESD. Furthermore, since the potential difference between high level and low level of the gate terminal of the transistor in the switch is less than (VDD−0), the problem of clock feedthrough would be solved.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A digital-to-analog converter, having at least one bit current-steering circuit, and the current-steering circuit comprising:

- a current source circuit for outputting a bias current;
- a first switch having a first input/output terminal coupled to a first output terminal of the current-steering circuit, a control terminal, and a second input/output terminal coupled to the current source circuit to receive the bias current, wherein the first switch determines whether the first and the second input/output terminals are conducted by one another according to a status of the control terminal;
- a first feedback circuit coupled to the first switch, including:
  - a first transistor having a first source/drain terminal coupled to the control terminal of the first switch, a second source/drain terminal, and a gate terminal; and
  - a first resistance element having a first terminal coupled to the gate terminal of the first transistor, and a second terminal coupled to the first input/output terminal of the first switch; and
- a first amplifier circuit having an input terminal coupled to the second input/output terminal of the first switch, an output terminal coupled to the second source/drain terminal of the first transistor, and a voltage terminal coupled to a voltage source.

2. The digital-to-analog converter according to claim 1, wherein the current source circuit comprises:

- a second transistor having a first source/drain terminal coupled to the first input/output terminal of the first switch to output the bias current, a gate terminal coupled to a first bias voltage, and a second source/drain terminal; and
- a third transistor having a first source/drain terminal coupled to the second source/drain terminal of the second transistor, a gate terminal coupled to a second bias voltage, and a second source/drain terminal coupled to the voltage source.

3. The digital-to-analog converter according to claim 1, wherein the first switch has a fourth transistor having a first and a second source/drain terminals as the first and the second input/output terminals, and a gate terminal as the control terminal.

4. The digital-to-analog converter according to claim 1, wherein the first amplifier circuit has an OP amplifier.

5. The digital-to-analog converter according to claim 1, wherein the first amplifier circuit is a common source amplifier.

6. The digital-to-analog converter according to claim 1, wherein the current-steering circuit further comprises:

- a fifth transistor having a first source/drain terminal coupled to a common voltage, a gate terminal coupled to the control terminal of the first switch through a first capacitor and receiving a switch signal, and a second source/drain terminal; and
- a sixth transistor having a first source/drain terminal coupled to the second source/drain terminal of the fifth transistor, a gate terminal coupled to a control signal, and a second source/drain terminal coupled to the control terminal of the first switch.

7. The digital-to-analog converter according to claim 1, wherein the current-steering circuit further comprises:

a second switch having a first input/output terminal coupled to a second output terminal of the current-steering circuit, a control terminal, and a second input/output terminal coupled to the current source circuit to receive the bias current, wherein the second switch determines whether the first and the second input/output terminals of the second switch are conducted according to a status of the control terminal;

a second feedback circuit coupled to the second switch, including:

a seventh transistor having a first source/drain terminal coupled to the control terminal of the second switch, a second source/drain terminal, and a gate terminal; and a second resistance element having a first terminal coupled to the gate terminal of the seventh transistor, and a second terminal coupled to the first input/output terminal of the second switch; and a second amplifier circuit having an input terminal coupled to the second input/output terminal of the second switch, an output terminal coupled to the second source/drain terminal of the seventh transistor, and a voltage terminal coupled to the voltage source.

8. The digital-to-analog converter according to claim 7, wherein the current-steering circuit further comprises:

a eighth transistor having a first source/drain terminal coupled to the common voltage, a gate terminal coupled to the control terminal of the second switch through a second capacitor and receiving an inverted switch signal, and a second source/drain terminal; and a ninth transistor having a first source/drain terminal coupled to the second source/drain terminal of the eighth transistor, a gate terminal coupled to a control signal, and a second source/drain terminal coupled to the control terminal of the second switch.

9. The digital-to-analog converter according to claim 7, wherein the second amplifier circuit has an OP amplifier.

10. The digital-to-analog converter according to claim 7, wherein the second amplifier circuit is a common source amplifier.

* * * * *